(12) United States Patent
Fattal et al.

(10) Patent No.: US 7,781,853 B2
(45) Date of Patent: Aug. 24, 2010

(54) PLASMON-ENHANCED ELECTROMAGNETIC-RADIATION-EMITTING DEVICES AND METHODS FOR FABRICATING THE SAME

(75) Inventors: David A. Fattal, Mountain View, CA (US); Nathaniel J. Quitoriano, Pacifica, CA (US); Hans S. Cho, Palo Alto, CA (US); Marco Fiorentino, Mountain View, CA (US); Theodore I. Kamins, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 509 days.

(21) Appl. No.: 11/881,266

(22) Filed: Jul. 26, 2007

(65) Prior Publication Data

US 2009/0028493 A1    Jan. 29, 2009

(51) Int. Cl.
  *H01L 27/15*  (2006.01)
  *H01L 31/12*  (2006.01)
  *H01L 27/14*  (2006.01)
  *H01L 31/00*  (2006.01)
(52) U.S. Cl. .................................... 257/428; 257/79
(58) Field of Classification Search ............. 257/79–103, 257/428–448, E21.001, E31
  See application file for complete search history.

(56) References Cited

U.S. PATENT DOCUMENTS 5,067,788 A * 11/1991 Jannson et al. ................ 385/2
5,729,641 A * 3/1998 Chandonnet et al. ........... 385/2
6,034,809 A    3/2000 Anemogiannis
6,521,916 B2  2/2003 Roberts
7,177,515 B2  2/2007 Estes
7,244,932 B2  7/2007 Nakasuji

OTHER PUBLICATIONS

International Search Report; PCT Patent Application No. PCT/US2008/008716, filed Jul. 16, 2008; search issued by Korean Patent Office (ISA) Dec. 26, 2008.
Vuckovic et al., "Surface plasmon enhanced light-emitting diode", IEEE Journal of Quantum Electronics, Oct. 10, 2000.
Barnes, "Electromatic crystals for surface plasmon polaritons and the extraction of light from emissive devices", Journal of Lightwave Technology, Nov. 1999.

* cited by examiner

*Primary Examiner*—Cuong Q Nguyen (57) ABSTRACT

Various embodiments of the present invention are directed to surface-plasmon-enhanced electromagnetic-radiation-emitting devices and to methods of fabricating these devices. In one embodiment of the present invention, an electromagnetic-radiation-emitting device comprises a multilayer core, a metallic device layer, and a substrate. The multilayer core has an inner layer and an outer layer, wherein the outer layer is configured to surround at least a portion of the inner layer. The metallic device layer is configured to surround at least a portion of the outer layer. The substrate has a bottom conducting layer in electrical communication with the inner layer and a top conducting layer in electrical communication with the metallic device layer such that the exposed portion emits surface-plasmon-enhanced electromagnetic radiation when an appropriate voltage is applied between the bottom conducting layer and the top conducting layer.

20 Claims, 9 Drawing Sheets

PLASMON-ENHANCED ELECTROMAGNETIC-RADIATION-EMITTING DEVICES AND METHODS FOR FABRICATING THE SAME

TECHNICAL FIELD

Embodiments of the present invention are directed to electromagnetic-radiation-emitting devices, and, in particular, to plasmon-enhanced electromagnetic-radiation-emitting devices that can be implemented in photonic devices.

BACKGROUND

In recent years, the increasing density of microelectronic devices on integrated circuits has lead to a technological bottleneck in the density of metallic signal lines that can be used to interconnect these devices. In addition, the use of metallic signal lines yields a significant increase in power consumption and difficulties with synchronizing the longest links positioned on top of most circuits. Rather than transmitting information as electrical signals via signal lines, the same information can be encoded in electromagnetic radiation ("ER") and transmitted via waveguides, such as optical fibers, ridge waveguides, and photonic crystal waveguides. Transmitting information encoded in ER via waveguides has a number of advantages over transmitting electrical signals via signal lines. First, degradation or loss is much less for ER transmitted via waveguides than for electrical signals transmitted via signal lines. Second, waveguides can be fabricated to support a much higher bandwidth than signal lines. For example, a single Cu or Al wire can only transmit a single electrical signal, while a single optical fiber can be configured to transmit about 100 or more differently encoded ER.

Recently, advances in materials science and semiconductor fabrication techniques have made it possible to develop photonic devices that can be integrated with electronic devices, such as CMOS circuits, to form photonic integrated circuits ("PICs"). The term "photonic" refers to devices that can operate with either classically characterized electromagnetic radiation or quantized electromagnetic radiation with frequencies that span the electromagnetic spectrum. PICs are the photonic equivalent of electronic integrated circuits and may be implemented on a wafer of semiconductor material. In order to effectively implement PICs, passive and active photonic components are needed. Waveguides and attenuators are examples of passive photonic components that can typically be fabricated using conventional epitaxial and lithographic methods and may be used to direct the propagation of ER between microelectronic devices. Physicists and engineers have recognized a need for active photonic components, such as ER emitting devices and modulators, that can be implemented in PICs and other photonic devices.

SUMMARY

Various embodiments of the present invention are directed to surface-plasmon-enhanced electromagnetic-radiation-emitting devices and to methods of fabricating these devices. In one embodiment of the present invention, an electromagnetic-radiation-emitting device comprises a multilayer core, a metallic device layer, and a substrate. The multilayer core has an inner layer and an outer layer, wherein the outer layer is configured to surround at least a portion of the inner layer. The metallic device layer is configured to surround at least a portion of the outer layer. The substrate has a bottom conducting layer in electrical communication with the inner layer and a top conducting layer in electrical communication with the metallic device layer such that the exposed portion emits surface-plasmon-enhanced electromagnetic radiation when an appropriate voltage is applied between the bottom conducting layer and the top conducting layer.

DETAILED DESCRIPTION

Various embodiments of the present invention are directed to surface-plasmon-enhanced electromagnetic-radiation-emitting ("SPE ERE") devices and to methods of fabricating the SPE ERE devices. An SPE ERE device includes an ER source that can generate modulated ER with greater speed and efficiency than typical ER emitting sources, such as light emitting diodes. SPE ERE devices can be used as sources of modulated ER in a variety of different PICs. In the various device and fabrication embodiments described below, a number of structurally similar components comprising the same materials have been provided with the same reference numerals and, in the interest of brevity, an explanation of their structure and function is not repeated.

Figure 1A:
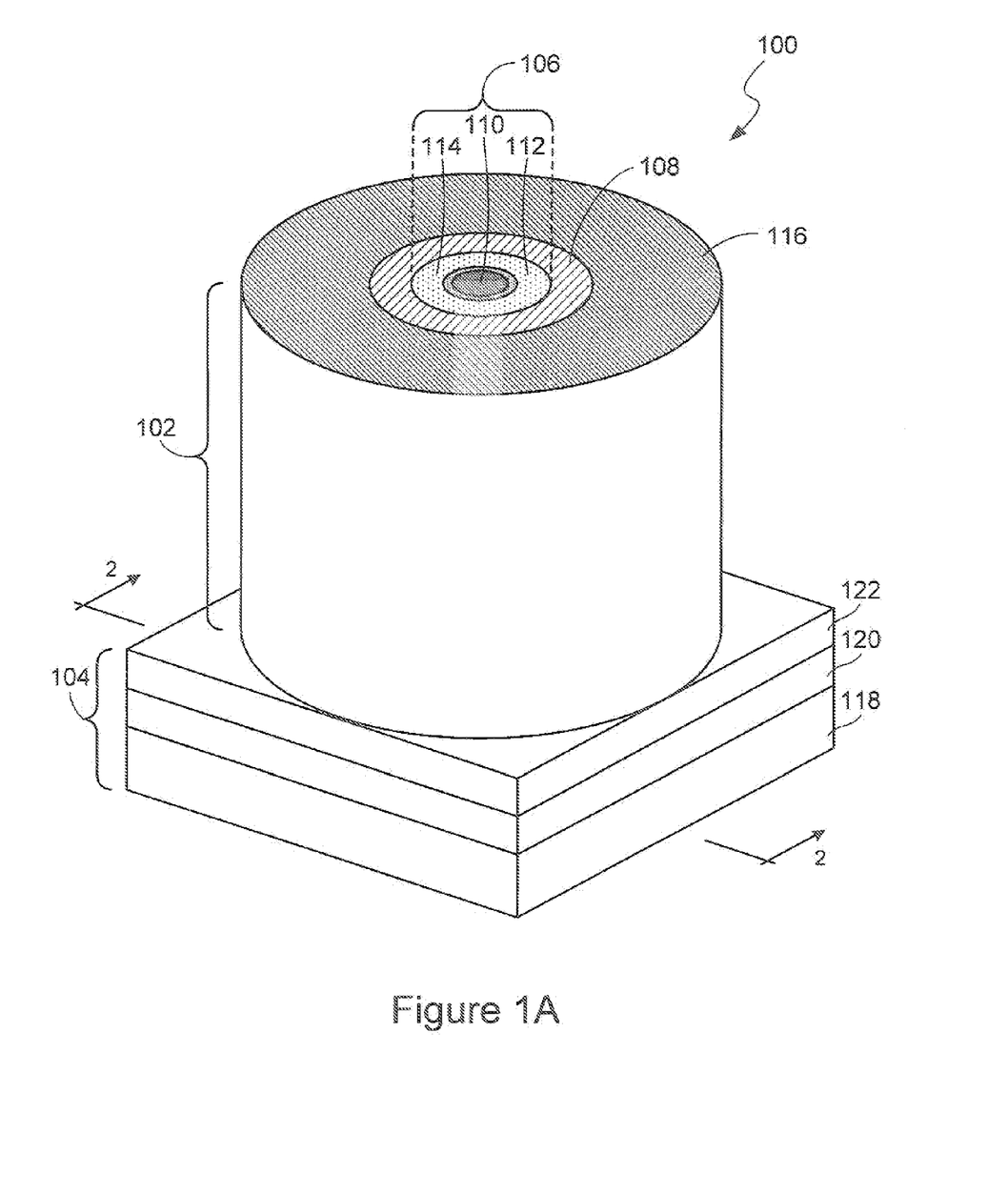
FIG. 1A shows an isometric view of an electromagnetic-radiation-emitting device in accordance with embodiments of the present invention

FIG. 1A shows an isometric view of an SPE ERE device 100, respectively, in accordance with embodiments of the present invention. SPE ERE device 100 comprises a multilayer ER source 102 that is supported by and in electrical communication with a layered substrate 104. ER source 102 includes a multilayer core 106 and a metallic device layer 108 which is configured to surround at least a portion of multilayer core 106. Multilayer core 106 includes an inner layer 110 and an outer layer 112 surrounding at least a portion of inner layer 110. Multilayer core 106 may also include an intermediate layer 114 positioned between inner layer 110 and outer layer 112 and an optional outer layer 116 surrounding at least a portion of metallic device layer 108. Layered substrate 104 may include a bottom conducting layer 118, a middle dielectric layer 120, and a top conducting layer 122. Middle dielectric layer 120 serves as a layer of insulation between top conducting layer 122 and bottom conducting layer 118. Top conducting layer 122 can be an extended portion of metallic device layer 108, or top conducting layer 122 can be a comprised of a semiconductor or conductor that is in electrical communication with metallic device layer 108. Bottom conducting layer 118 can be the Si layer of a silicon-on-insulator substrate where the Si layer is in electrical communication with inner layer 110 as described below with reference to FIG. 2.

Figure 1B:
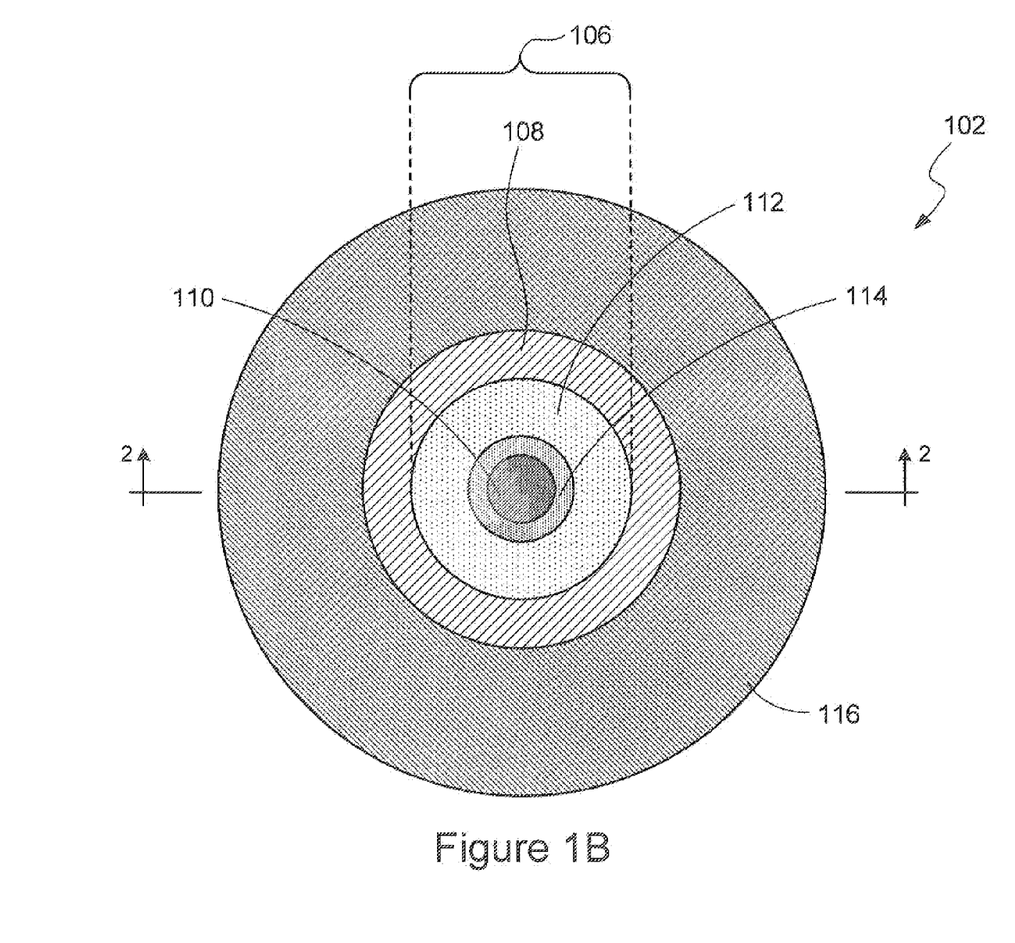
FIG. 1B shows a top view of the electromagnetic-radiation-emitting device shown in FIG. 1A in accordance with embodiments of the present invention.

FIG. 1B shows a top view of ER source 102 in accordance with embodiments of the present invention. As shown in FIGS. 1A-B, layers 108, 110, 112, and 114 of multilayer core 106 are exposed in order to emit electromagnetic radiation generated within ER source 102, as described below with reference to FIG. 3. Note that ER source 102 shown in FIG. 1 is not limited to a cylindrical configuration. For example, ER source 102 can have an elliptical, a square, a rectangular, hexagonal an irregular, or any other suitable cross-sectional shape.

Optional outer layer 116 can be composed of a metal or semiconductor, and both optional outer layer 116 and middle layer 120 can be comprised of $SiO_2$, $Si_3N_4$, or another suitable dielectric material. Metallic device layer 108 can be comprised of gold, titanium, nickel, chromium, platinum, palladium, aluminum, or another suitable metal conductor or metal alloy. Multilayer core 106 and bottom conducting layer 118 can be comprised of an indirect bandgap elemental semiconductor or a direct or indirect bandgap compound semiconductor. Elemental semiconductors include Si and Ge. Compound semiconductors are typically III-V materials, where Roman numerals III and V represent elements in the third and fifth columns of the Periodic Table of the Elements. Compound semiconductors can be classified according to the quantities of III and V elements comprising the semiconductor. For example, binary semiconductor compounds include GaAs, InP, InAs, and GaP; ternary semiconductor compounds include $GaAs_yP_{1-y}$, where y ranges between 0 and 1; and quaternary semiconductor compounds include $In_xGa_{1-x}As_yP_{1-y}$, where both x and y range between 0 and 1.

Elemental composition of compound semiconductor can be varied in order to emit electromagnetic radiation with a particular wavelength. For example, GaAs is a direct bandgap III-V semiconductor that emits electromagnetic radiation with wavelengths in the infrared portion of the electromagnetic spectrum, while GaP is an indirect bandgap semiconductor that emits electromagnetic radiation with wavelengths in a different portion of the electromagnetic spectrum. Quaternary semiconductors can be used to emit electromagnetic radiation over other portions of the electromagnetic spectrum. For example, the elemental quantities in InAlGaP semiconductors can be varied to emit electromagnetic radiation with wavelengths in the red, yellow, and orange visible portions of the electromagnetic spectrum, and the elemental quantities of AlGaInN semiconductors can be varied to emit electromagnetic radiation with wavelengths in the blue and green visible portions of the electromagnetic spectrum.

In certain embodiments of the present invention, inner layer 110 can be a p-type semiconductor, and outer layer 112 can be an n-type semiconductor. In other embodiments of the present invention, inner layer 110 can be an n-type semiconductor, and outer layer 112 can be a p-type semiconductor. In other words, inner layer 110 and outer layer 112 form two layers of a pn diode. The terms "p-type semiconductor" refer to intrinsic semiconductors that have been doped with an electron acceptor impurity, such as boron in silicon, in order to increase the number of free positive carrier called "holes," and the terms "n-type semiconductor" refer to intrinsic semiconductors that have been doped with an electron donor impurity, such as arsenic in silicon, in order to increase the number of free electrons. Holes and electrons are two types of charge carriers. Intermediate layer 114 can be a depletion region which forms across the junction or interface of a p-type semiconductor and an n-type semiconductor. The carrier concentration difference between inner layer 110 and outer layer 112 creates an electric field across the depletion region, as described below. Carriers diffuse from regions of high concentration to regions of low concentration. In particular, holes originating in a p-type semiconductor of multilayer core 106 diffuse part way into the n-type semiconductor of multilayer core 106, which has a lower concentration of holes than the p-type semiconductor. Similarly, electrons from the n-type semiconductor of multilayer core 106 diffuse part way into the p-type semiconductor of multilayer core 106, which has a higher concentration of electrons than the p-type semiconductor. As charge carriers diffuse, they leave behind the ionized dopants that created them. This charge carrier migration stops when the electric field created between the n-type and p-type semiconductor layers of multilayer core 106 force a number of charge carriers to drift back at the same rate charge carriers diffuse, which, in turn, leaves a depletion region represented by intermediate layer 114. The thickness of intermediate layer 114 depends upon the dopant concentrations in inner layer 110 and outer layer 112. In other embodiments of the present invention, intermediate layer 114 can be comprised of an intrinsic semiconductor, in which case, inner layer 110, intermediate layer 114, and outer layer 112 form the three layers of a p-i-n diode.

Figure 2:
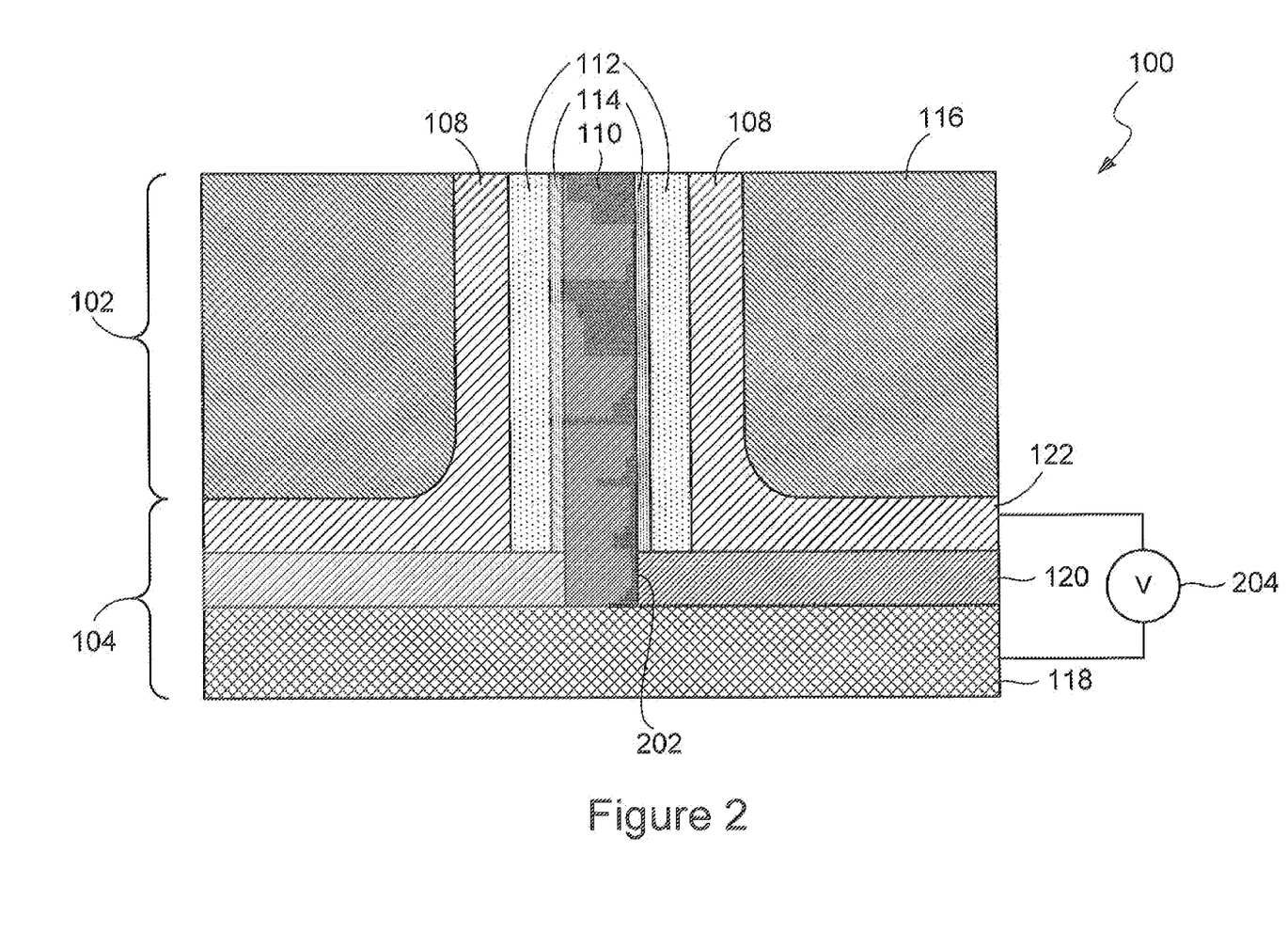
FIG. 2 shows a cross-sectional view of the electromagnetic-radiation-emitting device, along a line 2-2 shown in FIG. 1, in accordance with embodiments of the present invention.

FIG. 2 shows a cross-sectional view of SPE ERE device 100, along a line 2-2 shown in FIG. 1, in accordance with embodiments of the present invention. As shown in FIG. 2, ER source 102 is supported by substrate 104. The inner surface of metallic device layer 108 is in contact with the outer surface of outer layer 112, and metallic device layer 108 extends horizontally outward at the bottom to form top conducting layer 122 of substrate 104. Top conducting layer 122 and metallic device layer 108 can be formed from a single piece of metal, as shown in FIG. 2. However, in other embodiments of the present invention, top conducting layer 122 can be formed from a separate metallic layer or semiconductor layer. In these embodiments, metallic device layer 108 and top conducting layer 122 are in electrical communication with one another. A portion of inner layer 110 passes through an opening 202 in middle dielectric layer 120, and the bottom surface of inner layer 110 is in contact with bottom conducting layer 118 so that inner layer 110 can be in electrical communication with bottom conducting layer 118. As mentioned above with reference to FIG. 1, bottom conducting layer 118 can be the Si layer of a silicon-on-insulator substrate. Middle dielectric layer 120 provides a layer of electrical insulation between top conducting layer 122 and bottom conducting layer 118. Top conducting layer 122 and bottom conducting layer 118 are in electrical communication with a voltage source 204.

Figure 3:
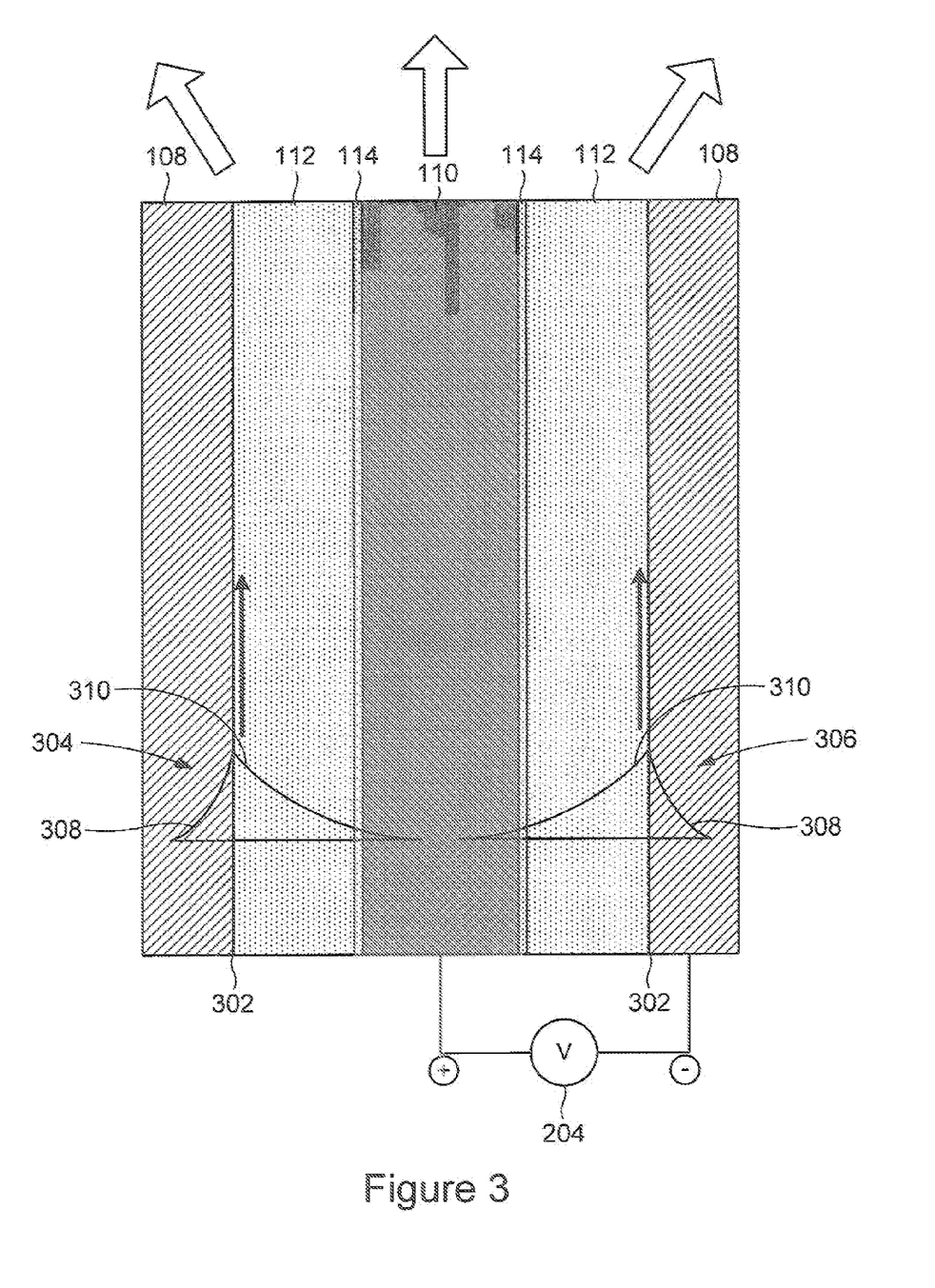
FIG. 3 shows a cross-sectional view of a multilayer core and a metallic device layer in accordance with embodiments of the present invention.

FIG. 3 shows a cross-sectional view of multilayer core 106 and metallic device layer 108 in accordance with embodiments of the present invention. Rather than referring to the cross-sectional view shown in FIG. 2, for the sake of simplicity in describing the operation of SPE ERE device 100, voltage source 204 is connected directly to inner layer 110 and metallic device layer 108. Assuming that inner layer 110 is a p-type semiconductor and outer layer 112 is an n-type semiconductor, a positive voltage applied to inner layer 110 and a negative voltage applied to outer layer 112 causes the electrons in outer layer 112 to flow toward intermediate layer 114 and the holes in inner layer 110 to flow toward intermediate layer 114. As a result, the width of intermediate layer 114 narrows. When the level of the applied voltage is large enough, the electrons combine with the holes in or near intermediate layer 114 releasing energy in a process called "recombination." As long as the voltage is applied, electrons and holes continue to flow through the layers 110 and 112 and undergo recombination in or near intermediate layer 114. For a multilayer core 106 comprised of an indirect semiconductor, a portion of the energy released is non-radiative, and the remainder is emitted as photons. By contrast, for a multilayer core 106 comprised of a direct semiconductor, most of the energy is released as photons. This is the same process by which ER is typically emitted from a light emitting diode.

Instead of forming photons in the multilayer core 106, an electron-hole pair can recombine into a surface plasmon propagating along interface 302 between outer layer 112 and metallic device layer 108. Plasmons are modes of ER that correspond to quantized states of electron plasma oscillations in a metal. A surface plasmon is a mode of electron excitation existing on the surface of a metal and has both longitudinal and transverse components. Surface plasmons can feature a high density electric field and slow group velocities leading to a substantial increase in the radiative recombination rate of an electron-hole pair. Under the right design, an electron-hole pair will most of the time decay into a surface plasmon mode, rather than into a photon or through a non-radiative channel. The recombination rate and the radiative efficiency of the device will be increased as a result. After propagating along the wire, the surface plasmon will itself decay into free space radiation upon reaching the edge of the wire.

FIG. 3 includes a schematic representation of portions 304 and 306 of a surface plasmon propagating upward along interface 302 of multilayer core 106 and metallic device layer 108. Surface plasmons have both transverse and longitudinal electromagnetic field components. The magnetic field component is parallel to interface 302 and perpendicular to the propagation direction, and the electric field component is parallel to the direction of the surface plasmon propagation and perpendicular to interface 302. Curve 308 represents the extent to which the electric field component extends into metallic device layer 108, and curve 310 represents the extent to which the electric field component extends into multilayer core 106. Curves 308 and 310 show how the electric field components decay exponentially away from interface 302. Because the dielectric constant associated with metallic device layer 108 is greater than the dielectric constant associated with multilayer core 106, the electric field component has shorter penetration depth in metallic device layer 108 than in multilayer core 106.

SPE ERE device 100 embodiments can more efficiently generate ER and more quickly modulate ER than typical light emitting diodes. The surface plasmon speeds up the electron/hole recombination process taking place within the multilayer core 106. As a result, ER source 102 can be operated as a high-speed ER emitting modulator by varying the voltage applied to ER source 102. In other words, by varying the voltage applied to the ER source 102, the ER output can be modulated such that analog or digital information appears in the emitted ER, which can be directed at a detector. In addition, ER source 102 can be modulated at a much higher rate than can a typical electromagnetic-radiation-emitting diode, such as a light emitting diode. In addition, ER source 102 may be more efficient at emitting ER than a typical ER emitting diode, such as a light emitting diode, since the ratio of radiative to non-radiative recombination rates may be substantially increased. In other words, by forming surface plasmons along interface 302, ER source 102 may emit higher intensity ER which can be modulated more quickly than ER generated from a typical ER emitting diode.

FIGS. 4A-4I show isometric and cross-sectional views that correspond to steps of a method for fabricating the SPE ERE device 100, shown in FIG. 1, in accordance with embodiments of the present invention. Initially, as shown in an isometric view of FIG. 4A and a cross-sectional view of FIG. 4B, middle dielectric layer 120 can be formed on bottom conducting layer 118 using chemical vapor deposition ("CVD"), physical vapor depositiontion, thermal oxidation, or spin on glass.

Figure 4A:
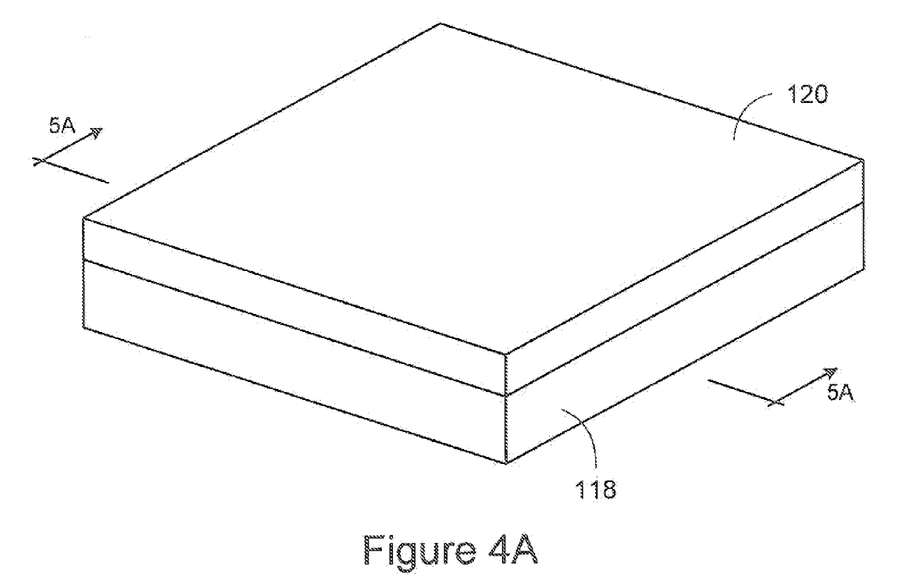
FIGS. 4A-4I show isometric and cross-sectional views that correspond to steps of a method for fabricating the electromagnetic-radiation-emitting device, shown in FIGS. 1-2, in accordance with embodiments of the present invention.
Figure 4B:
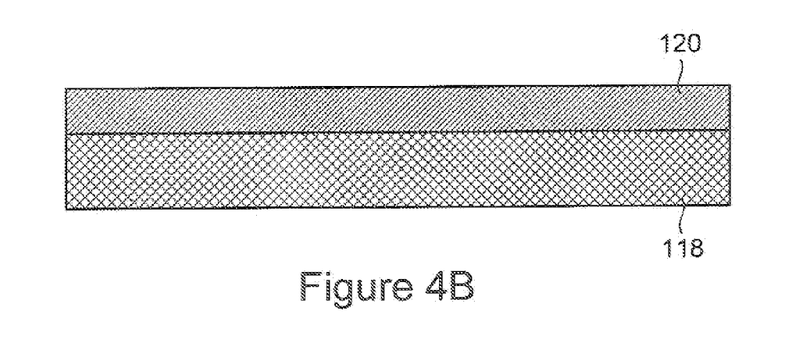
Figure 4C:
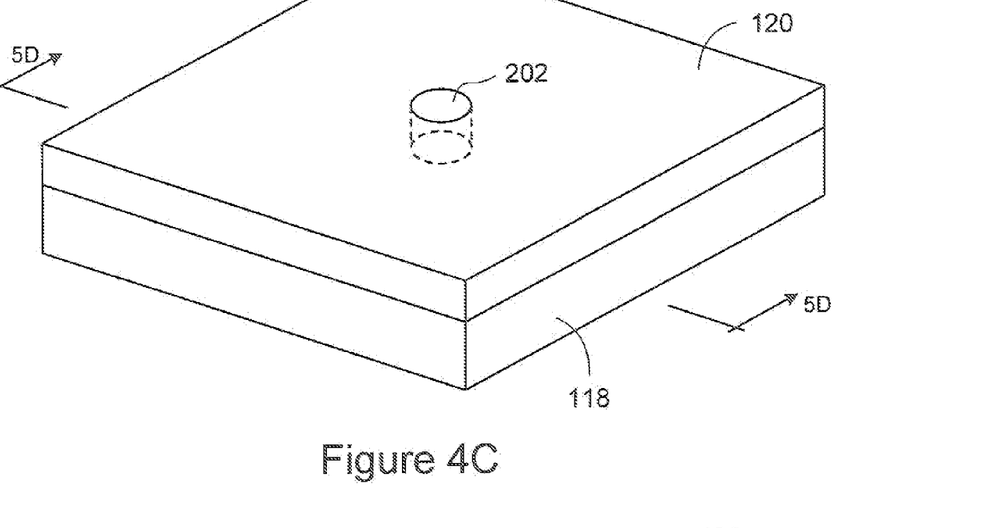
Figure 4D:
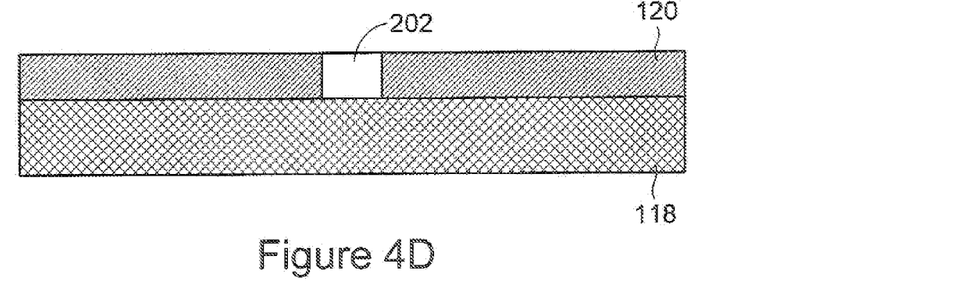

Next, as shown in an isometric view of FIG. 4C and in a cross-sectional view of FIG. 4D, opening 202 can be formed in middle dielectric layer 120 by first defining opening 202 using, for example, block-copolymer lithography, nanoimprint lithography, or electron beam lithography followed by removing the dielectric material from the region defining opening 202 using reactive ion etching, chemically assisted ion beam etching, or wet etching. In other embodiments of the present invention, opening 202 can be formed by focused ion beam milling. Opening 202 exposes a portion of the top surface of bottom conducting layer 118.

Figure 4E:
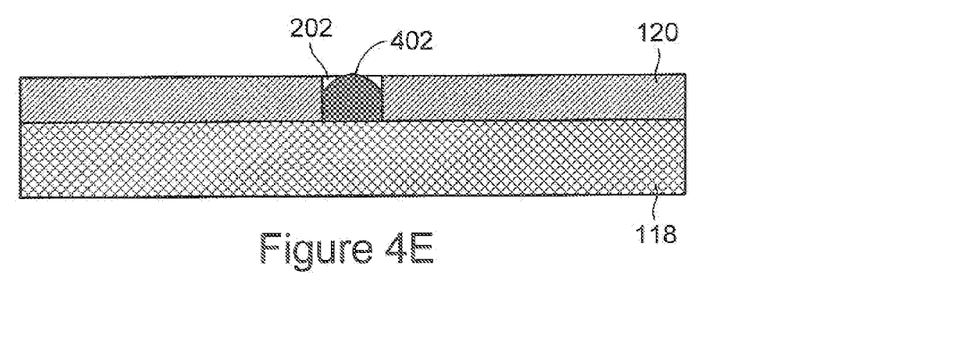
Figure 4F:
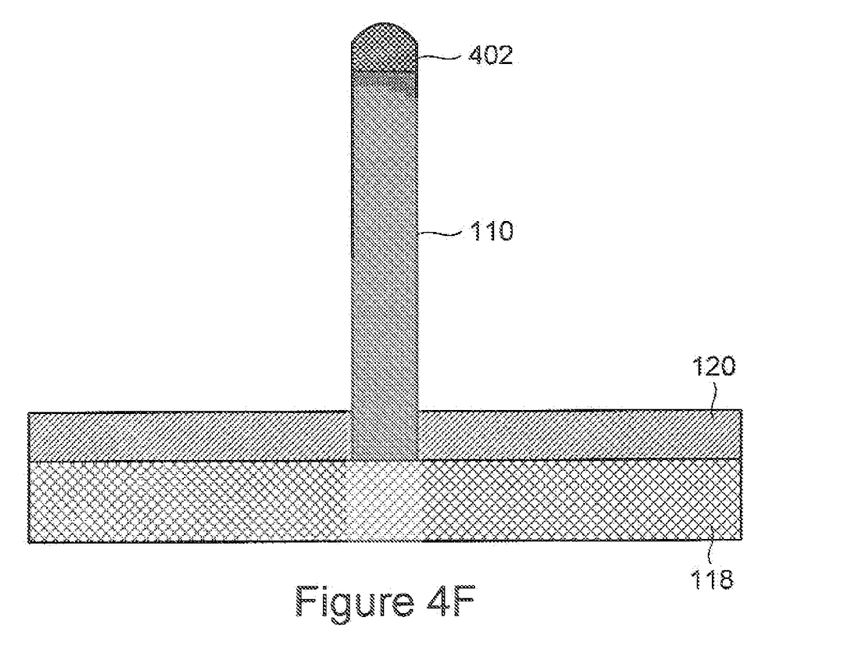

Next, as shown in FIG. 4E, using well-known methods, such as galvanic displacement, a seed particle 402 can be formed in opening 202. Seed particle 402 can be a gold, titanium, nickel, chromium, platinum, palladium, aluminum, or another suitable metal conductor or metal alloy. Next, as shown in FIG. 4F, using CVD, inner layer 110 can be grown in accordance with well-known vapor-liquid-solid ("VLS") growth mechanism or vapor-solid-solid ("VSS") growth mechanism. For example, in order to form an inner layer 110 composed of InAs, CVD can be used with vapor-phase reactants $In(CH_3)_3$ and $AsH_3$. Continued supply of the vapor-phase reactants $In(CH_3)_3$ and $AsH_3$ results in supersaturation, which eventually causes precipitation of excess liquid-phase InAs beneath seed particle 202. The excess InAs material precipitates from the supersaturated seed particle 402 onto the substrate, pushing seed particle 402 away from the substrate and forming the column of material, which is inner layer 110. The length of inner layer 110 can be controlled by varying the length of exposure time to the vapor-phase reactants. While inner layer 110 is growing, a p-type or an n-type dopant can be added to the CVD reaction chamber forming a p-type semiconductor inner layer 110 or an n-type semiconductor inner layer 110. Alternatively, inner layer 110 can be doped with a p-type or an n-type dopant after formation using implantation or dopant diffusion or implantation followed by annealing.

Figure 4G:
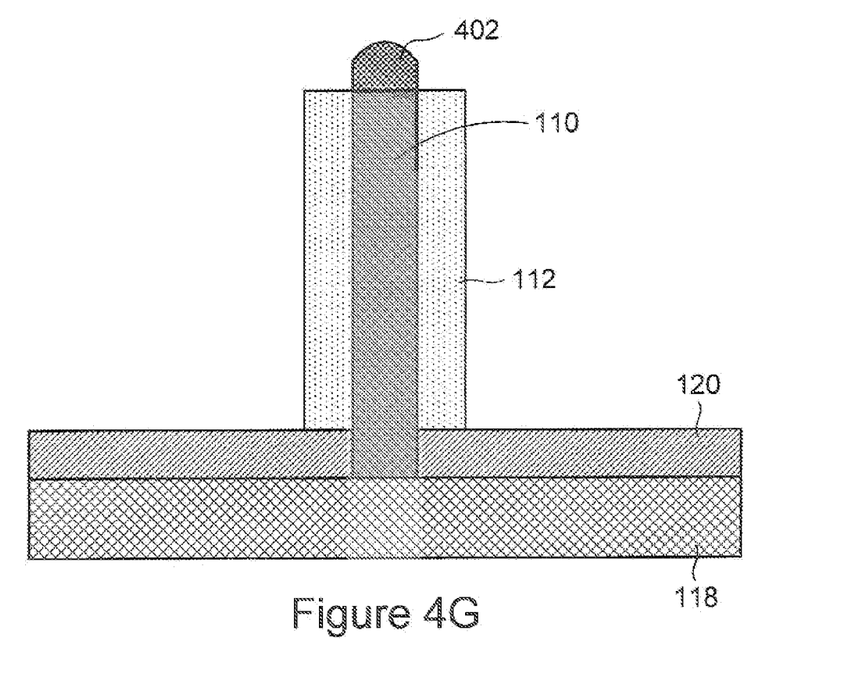

Next, as shown in FIG. 4G, outer layer 112 surrounding the outer surface of inner layer 110 can be formed using CVD. Outer layer 112 can be doped during formation by introducing a p-type or an n-type dopant to the reaction chamber while outer layer 112 is forming. Alternatively, a dopant can be added to already formed outer layer 112 using dopant diffusion or implantation followed by annealing. Intermediate layer 114 can be formed as a result of depletion, as described above, or intermediate layer 114 can be formed prior to forming outer layer 112 by depositing an intrinsic semiconductor layer 114 (not shown) over inner layer 110 using CVD followed by forming outer layer 112.

Figure 4H:
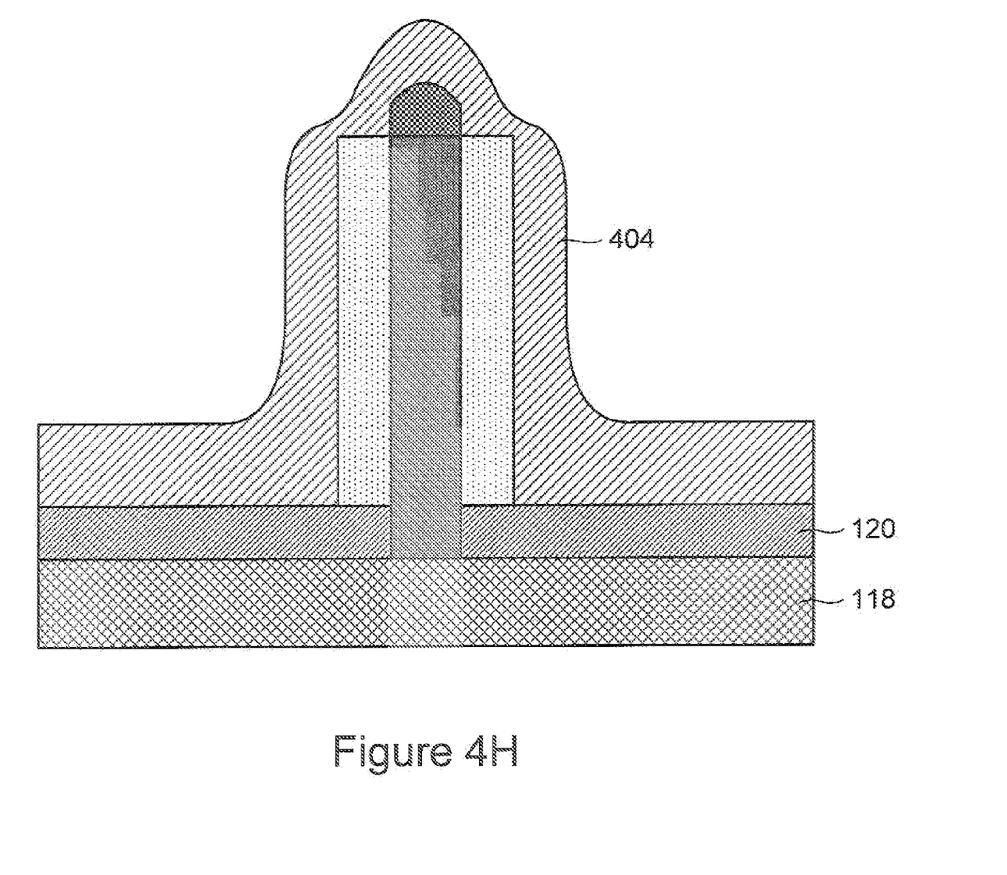
Figure 4I:
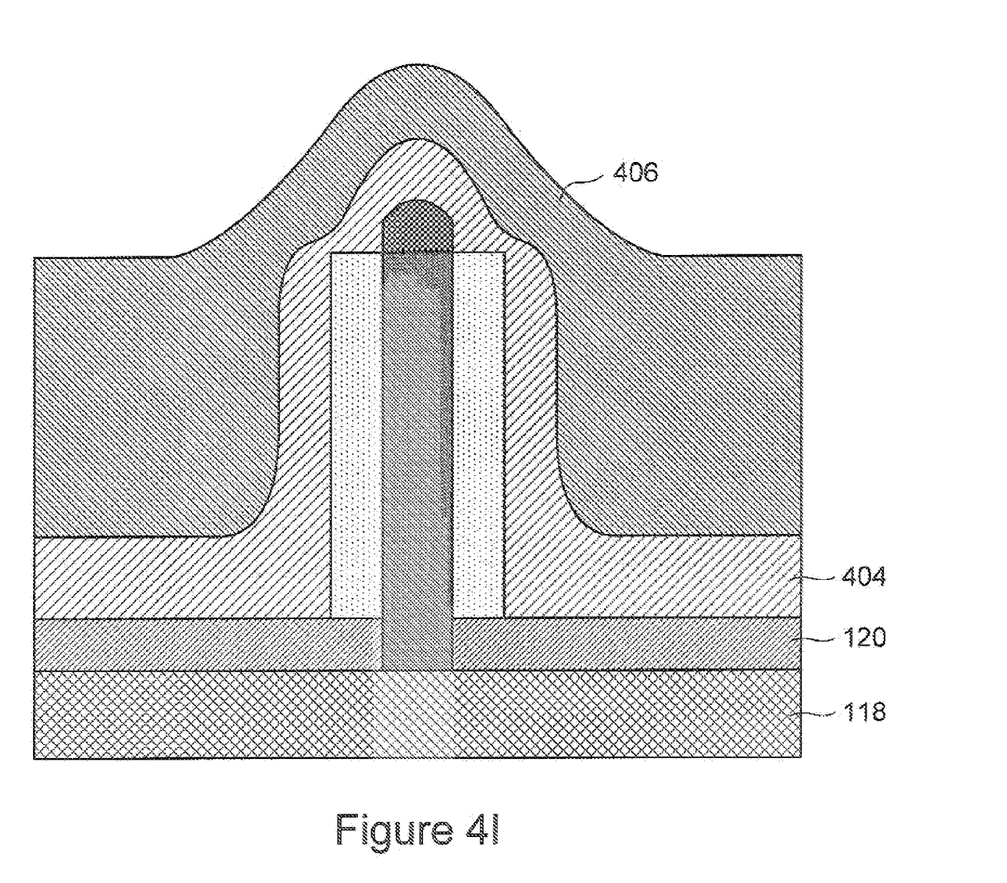

Next, as shown in FIG. 4H, a metallic layer 404 is deposited over substantially the entire exposed surface using CVD or MBD. As shown in FIG. 4I, an optional layer 406 can be deposited over metallic layer 404. Optional layer 406 and can be composed of a metal, semiconductor, or dielectric material and can be deposited using CVD, physical vapor deposition, such as sputtering, electron-beam evaporation, MBD, or spin on glass. Planarization techniques can be used to expose a portion of metallic device layer 108 and expose portions of inner layer 110 and out layer 112 in order to obtain SPE ERE device 100, shown in FIGS. 1-2.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purposes of illustration and description. They are not intended to be exhaustive of or to limit the invention to the precise forms disclosed. Obviously, many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

The invention claimed is:

1. An electromagnetic-radiation-emitting device comprising:
    a multilayer core having an inner layer and an outer layer, wherein the outer layer is configured to surround at least a portion of the inner layer;
    a metallic device layer configured to surround at least a portion of the outer layer; and
    a substrate having a bottom conducting layer in electrical communication with the inner layer and a top conducting layer in electrical communication with the metallic device layer such that the exposed portion emits surface-plasmon-enhanced electromagnetic radiation when an appropriate voltage is applied between the bottom conducting layer and the top conducting layer.

2. The device of claim 1 wherein the multilayer core further comprises one of:
    the inner layer is a p-type semiconductor and the outer layer is an n-type semiconductor; and
    the inner layer is an n-type semiconductor and the outer layer is a p-type semiconductor.

3. The device of claim 1 further comprises an intermediate layer located between the inner layer and the outer layer such that the intermediate layer can be a depletion region or composed of an intrinsic semiconductor.

4. The device of claim 1 wherein the top conducting layer further comprises one of:
    a metallic layer; and
    a semiconductor layer.

5. The device of claim 1 wherein the bottom conducting layer further comprises one of:
    a Si layer of silicon-on-insulator substrate; and
    a semiconductor layer.

6. The device of claim 1 wherein the metallic device layer further comprises one of:
    gold;
    titanium;
    nickel;
    chromium;
    platinum;
    palladium; and
    aluminum.

7. The device of claim 1 wherein the appropriate voltage applied to the inner layer and the metallic device layer is accomplished using a voltage source that is in electrical communication with the inner layer via the bottom conducting layer and is in electrical communication with the metallic device layer.

8. The device of claim 1 further comprises a top surface and a bottom surface wherein the top surface includes at least a portion of the inner layer, at least a portion of the outer layer, and at least a portion of the metallic device layer.

9. A photonic integrated circuit comprising an electromagnetic-radiation-emitting device configured in accordance with claim 1.

10. A method of fabricating an electromagnetic-radiation-emitting device, the method comprising:
    forming a dielectric layer on a semiconductor substrate, the dielectric layer having a top surface and a bottom surface attached to the semiconductor substrate;
    forming a multilayer core on the top surface of the dielectric layer, the multilayer core including an inner layer and an outer layer surrounding at least a portion of the inner layer, the inner layer extends through the dielectric layer and is in electrical contact with the semiconductor substrate; and
    depositing a metallic layer over the multilayer core.

11. The method of claim 10 further comprising forming a top surface that includes at least a portion of the inner layer, at least a portion of the outer layer, and at least a portion of the metallic layer.

12. The method of claim 11 wherein forming the top surface further comprises planarizing the electromagnetic-radiation-emitting device to expose the portions of the inner layer, the outer layer, and the metallic layer that form the exposed portion of the multilayer core.

13. The method of claim 10 wherein forming the dielectric layer on the semiconductor substrate further comprises employing one of:
    thermal oxidation;
    spin on glass;
    physical vapor deposition;
    chemical vapor deposition;
    molecular beam deposition; and
    wafer bonding.

14. The method of claim 10 wherein forming the multilayer core further comprises:
    forming a opening in the dielectric layer;
    depositing a seed material in the opening;
    growing the inner layer in the form of a column in the opening wherein the seed material in the opening serves as a nucleus for forming the column;
    depositing the outer layer.

15. The method of claim 14 further comprises depositing an optional layer of metal, semiconductor, or dielectric material over the metallic layer using one of:
    chemical vapor deposition; and
    physical vapor deposition.

16. The method of claim 14 wherein forming the opening in the dielectric layer further comprises defining the opening by employing one or more of:
    block-copolymer lithography,
    nanoimprint lithography, and
    electron-beam lithography,
followed by etching to form the opening using one or more of:
    reactive ion etching,
    chemically assisted ion beam etching, and
    wet etching.

17. The method of claim 14 wherein depositing the seed material in the opening further comprises employing galvanic displacement.

18. The method of claim 14 wherein growing the inner layer in the form of a column in the opening further comprises vapor-liquid-solid processing.

19. The method of claim 14 wherein depositing the outer layer further comprises employing one of:
    chemical vapor deposition; and
    molecular beam deposition.

20. The method of claim 10 wherein depositing the metallic layer further comprises employing one of:
    chemical vapor deposition; and
    physical vapor deposition.

* * * * *